US008299809B2

(12) United States Patent
Ting et al.

(10) Patent No.: US 8,299,809 B2
(45) Date of Patent: Oct. 30, 2012

(54) IN-LINE CHARACTERIZATION OF A DEVICE UNDER TEST

(75) Inventors: Tso-Hui Ting, Hopewell Junction, NY (US); Ping-Chuan Wang, Hopewell Junction, NY (US); Mohammed I. Younus, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 533 days.

(21) Appl. No.: 12/563,437

(22) Filed: Sep. 21, 2009

(65) Prior Publication Data
US 2011/0068813 A1    Mar. 24, 2011

(51) Int. Cl.
*G01R 31/00* (2006.01)
*G01R 31/10* (2006.01)

(52) U.S. Cl. .............................. 324/750.03; 324/750.06
(58) Field of Classification Search .................. None
See application file for complete search history.

(56) References Cited

U.S. PATENT DOCUMENTS

| | | | |
|---|---|---|---|
| 5,625,288 A | 4/1997 | Snyder et al. | |
| 6,293,698 B1* | 9/2001 | Alvis | 374/164 |
| 6,456,104 B1 | 9/2002 | Guarin et al. | |
| 6,521,469 B1 | 2/2003 | La Rosa et al. | |
| 6,731,179 B2 | 5/2004 | Abadeer et al. | |
| 7,218,132 B2 | 5/2007 | Krishnan et al. | |
| 7,239,163 B1 | 7/2007 | Ralston-Good | |
| 7,268,575 B1 | 9/2007 | Chen et al. | |
| 7,375,371 B2 | 5/2008 | La Rosa et al. | |
| 7,545,161 B2 | 6/2009 | Hsu et al. | |
| 7,649,377 B2* | 1/2010 | Ko et al. | 324/750.03 |
| 2003/0053517 A1 | 3/2003 | Bisping et al. | |
| 2008/0279252 A1 | 11/2008 | Vollertsen | |
| 2009/0048801 A1 | 2/2009 | Chandra | |
| 2009/0058455 A1 | 3/2009 | Ko et al. | |

FOREIGN PATENT DOCUMENTS
TW     20042854 A     6/2003

OTHER PUBLICATIONS

Search Report and Written Opinion.
Aichinger, T et al., "On the temperature dependence of NBTI recovery", Journal: Microelectronics Reliability, vol. 48, No. 8-9, pp. 1178-1184, Publisher: Elsevier Science Ltd. Country of Publication: UK Publication Date: Aug.-Sep. 2008.
Muth, W et al., "Bias temperature instability assessment of n- and p-channel MOS transistors using a polysilicon resistive heated scribe lane test structure", Journal: Microelectronics Reliability, vol. 44, No. 8, pp. 1251-1262, Publisher: Elsevier, Country of Publication: UK, Publication Date: Aug. 2004.

* cited by examiner

*Primary Examiner* — Jermele M Hollington
(74) *Attorney, Agent, or Firm* — Cantor Colburn LLP; Ian MacKinnon

(57) ABSTRACT

An apparatus is provided and includes a thermally isolated device under test to which first and second voltages are sequentially applied, a local heating element to impart first and second temperatures to the device under test substantially simultaneously while the first and second voltages are sequentially applied, respectively and a temperature-sensing unit to measure the temperature of the device under test.

14 Claims, 9 Drawing Sheets

IN-LINE CHARACTERIZATION OF A DEVICE UNDER TEST

BACKGROUND

Aspects of the present invention are directed to an in-line characterization with temperature profiling.

Reliable in-line characterization is becoming increasingly critical in the development of new technologies and in product manufacturing. At least one reason for this is that certain reliability degradation mechanisms are relatively sensitive to the choice of manufacturing processes to be employed and the materials used in the processes. Degradation mechanisms leading to bias temperature instability (BTI) are examples of these and are key reliability concerns in at least advanced integrated circuit (IC) technologies.

Accurate in-line BTI testing is not generally possible, however, due to the tendencies for devices under test conditions to recover from applied stress relatively quickly (i.e., fast recovery) after a point, such as the beginning of a test, where the stress is no longer applied. The tendency for devices to recover quickly is a particular concern at elevated stress temperatures. In these cases, negative-bias-temperature-instability (NBTI) in p-channel metal oxide semiconductor field-effect transistors (PMOSFETs) typically consists of two degradation mechanisms, which include, for example, interface-state generation between a channel (Si) and gate dielectrics (such as $SiO_2$). Interface-state generation is a thermally activated process that degrades the device and circuit performance.

It has been observed that the NBTI-shift due to interface-state generation recovers quickly during device tests after the stress bias is removed. Special high-speed instruments are needed in order to capture the real degradation before recovery occurs. The use of such instruments is generally impractical in production environments.

SUMMARY

In accordance with an aspect of the invention, an apparatus is provided and includes a thermally isolated device under test to which first and second voltages are sequentially applied, a local heating element to impart first and second temperatures to the device under test substantially simultaneously while the first and second voltages are sequentially applied, respectively and a temperature-sensing unit to measure the temperature of the device under test.

In accordance with an aspect of the invention, an apparatus is provided and includes a thermally isolated device under test to which first and second voltages are sequentially applied, a local heating element to impart first and second temperatures to the device under test independently of the first and second voltages being sequentially applied and a sensor to measure a characteristic of the device under test.

In accordance with an aspect of the invention, a method of conducting an in-line test of a device under test is provided and includes thermally isolating the device under test, with the device under test thermally isolated, applying first and second voltages to the device under test and, during the applying of the voltages, imparting first and second temperatures to the device under test independently of the applying of the voltages.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

Fast temperature switching between a stress condition and a test condition of a device under test (DUT) accelerates a degradation mechanism of the DUT to be in-line monitored during the stress condition and then "freezes" or halts the degradation during the test condition to avoid recovery. A test of bias temperature instability (BTI) stress of the DUT can thereby be conducted at elevated temperatures to accelerate shift, while a subsequent test can be carried out at lower temperatures to capture real BTI induced shift before significant recovery occurs. The methodology and structures for achieving this enables convenient and fast temperature changes during in-line testing so that general characterization of temperature-dependent device properties can be implemented.

Normally, as an example, testing of an in-line BTI mechanism of the DUT involves increasing a chuck temperature of a chuck on which the DUT is situated to a stress condition and holding the chuck temperature in that stress condition. The chuck temperature is typically about 85° C. or above in order to accelerate degradation of the DUT. After the chuck temperature is stabilized, which usually requires about 30 minutes, the DUT is biased at a stress point for a period of time, which is typically about 10 seconds or more. The biasing may refer to application of a stress voltage to the DUT. After the stress period, voltage is lowered to and stabilized at a test point before the first test data is taken. This may occur within about 1 second.

The set of tests to be conducted may include several drain-current versus gate-voltage curves at various bias conditions at each node, and the complete test sequence usually takes more than a few seconds in order to fully characterize the BTI-induced shifts in device parametrics. In any case, the chuck temperature stays at the elevated stress temperature even during the test sequence. Therefore, the results only represent those of a recovered device and do not reflect the real degradation of the DUT. In an example, there may be about 50% recovery after a mere one second delay in a test.

Figure 1:
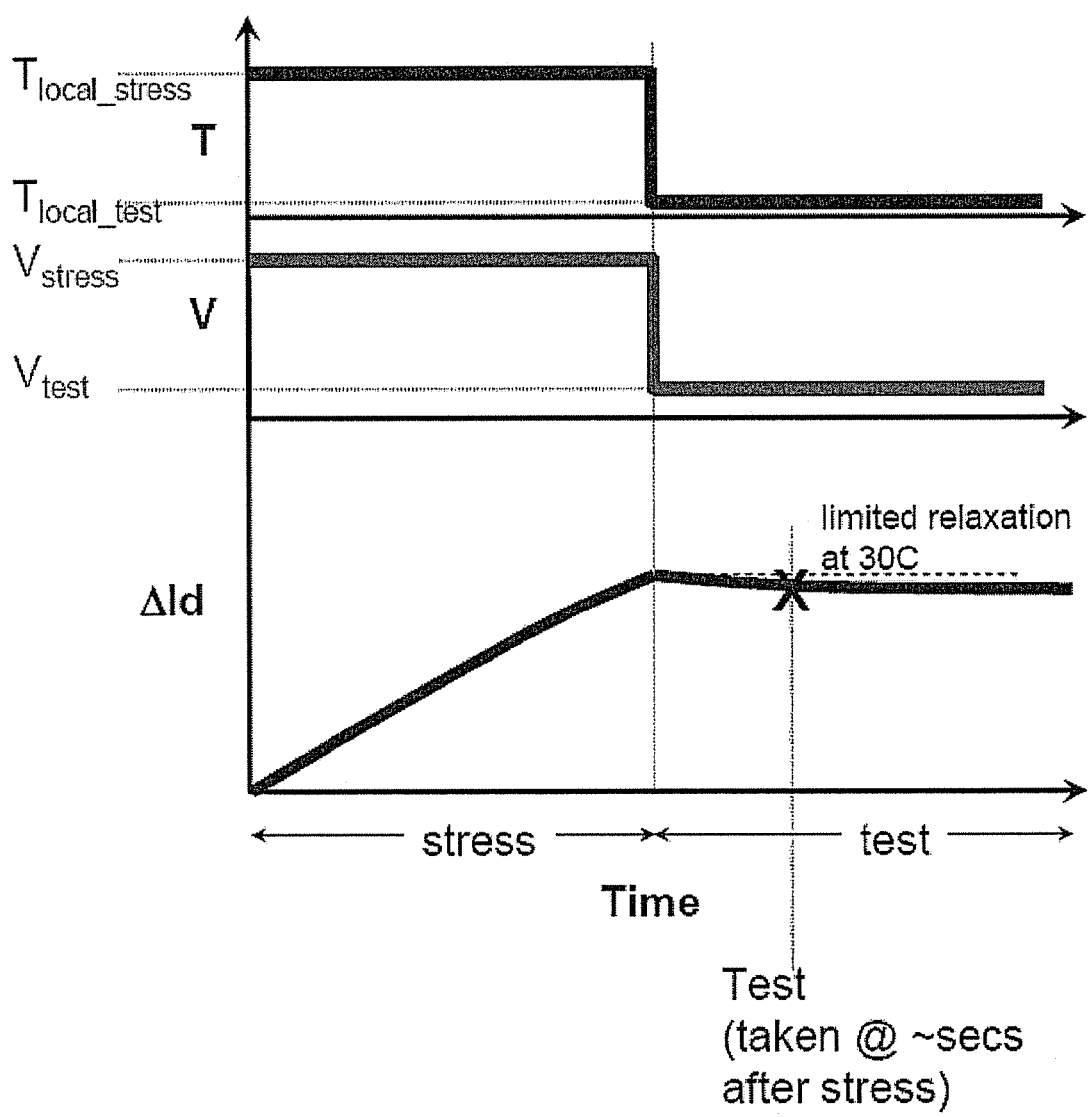
FIG. 1 is a diagram of a test methodology in accordance with an embodiment of the invention.

With reference to FIG. 1, a new test methodology is provided. Here, the chuck temperature is maintained at or about room temperature or even lower, while the elevated stress temperature is achieved by an embedded on-chip local heating element that is located proximate to or adjacent to the DUT. The local heater can be formed of resistive elements, such as doped polysilicon strips, diffusion resistors, or back-end-of-line (BEOL) TaN resistors, which can provide over 100° C. of localized heating. A degree of the localized heating may be a function of the power applied to the local heating element, which can be tailored by tuning the supply power to achieve a wide range of temperatures for various stress and test conditions. The time needed to reach the designated temperature with the local heater is on the order of milli-seconds (msec). As such, since the local heating can be eliminated substantially immediately once the local heater is powered off, an in-line test condition following a stress condition can be conducted with relatively high resolution in both time and temperature. This also allows for accurate results to be achieved before relaxation occurs.

In particular, as shown in FIG. 1, the local heater heats the DUT to the local stress temperature, $T_{local\_stress}$, while a voltage $V_{stress}$ is applied to the DUT during the stress condition time. At the initiation of the test condition, the local heater is powered off and the local temperature immediately returns to the chuck temperature, $T_{local\_test}$, while the applied voltage is reduced to $V_{test}$. At this point, degradation measurement of the DUT begins with, e.g., a measurement of the change in drain current through the DUT, $\Delta Id$.

Figure 2:
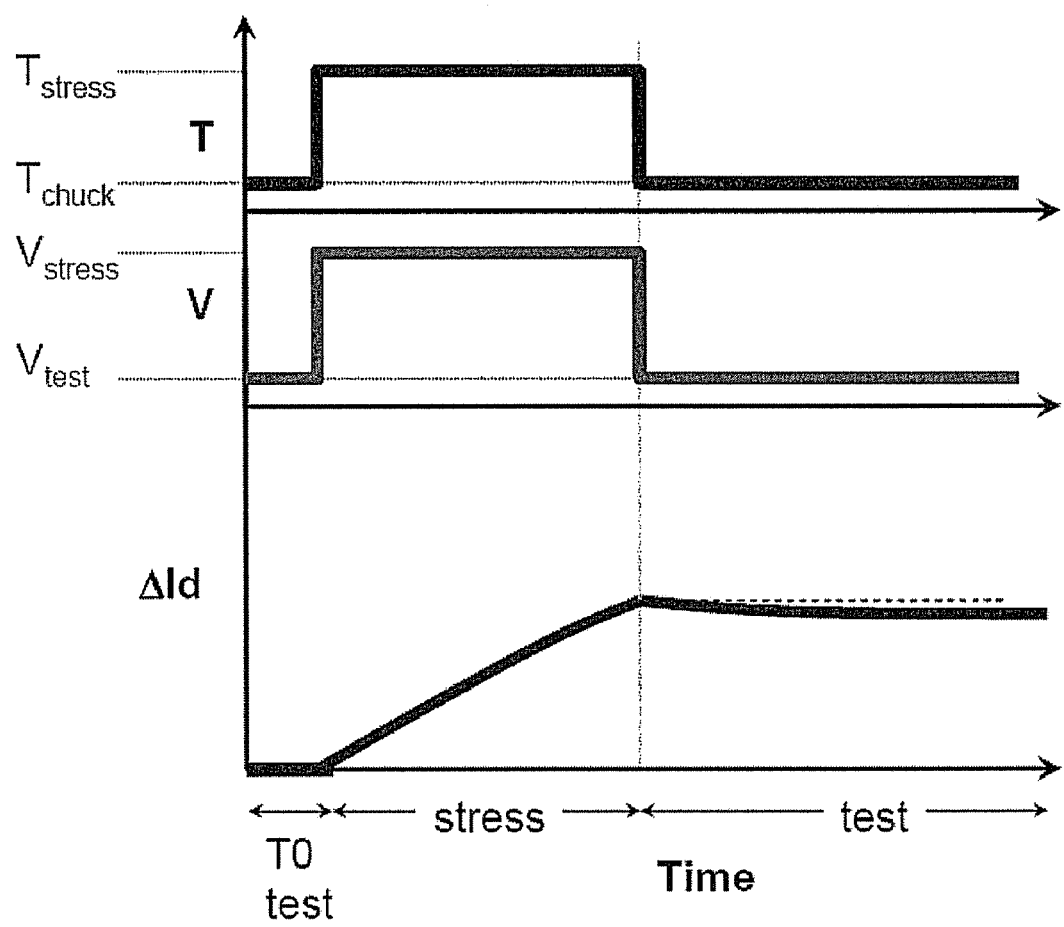
FIG. 2 is a diagram of a test methodology in accordance with another embodiment of the invention.

Since local temperature control may be independent of a voltage/current bias, a wide variety of temperature/bias stress and test conditions can be carried out. For example, FIG. 2 shows another stress/test sequence with a relatively low-temperature T0 test on a fresh device added before the stress procedure. In sequence of FIG. 2, a methodology similar to that of FIG. 1 is preceded by an initial condition during T0 when the local temperature is $T_{chuck}$ and the applied voltage is $V_{test}$.

Figure 3:
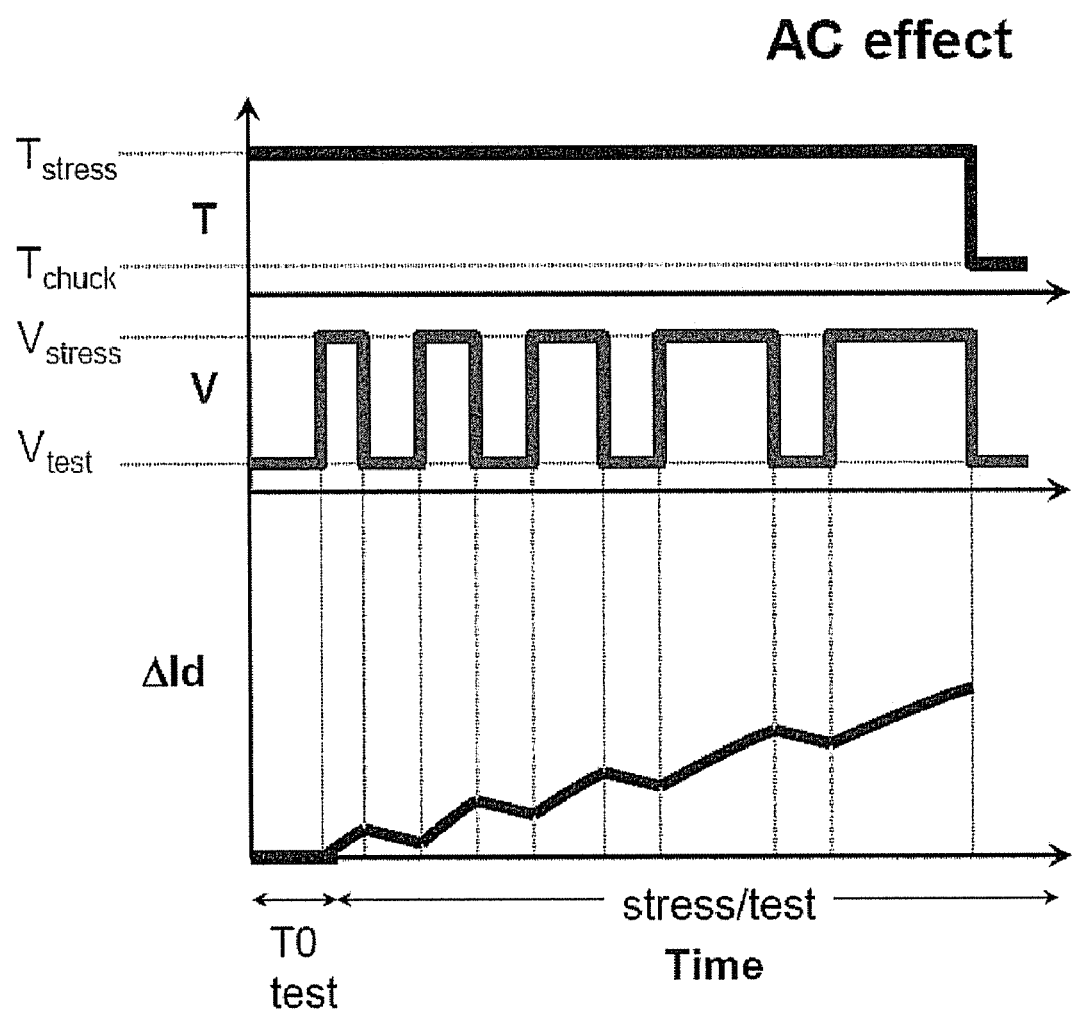
FIG. 3 is a diagram of a test methodology in accordance with another embodiment of the invention.
Figure 4:
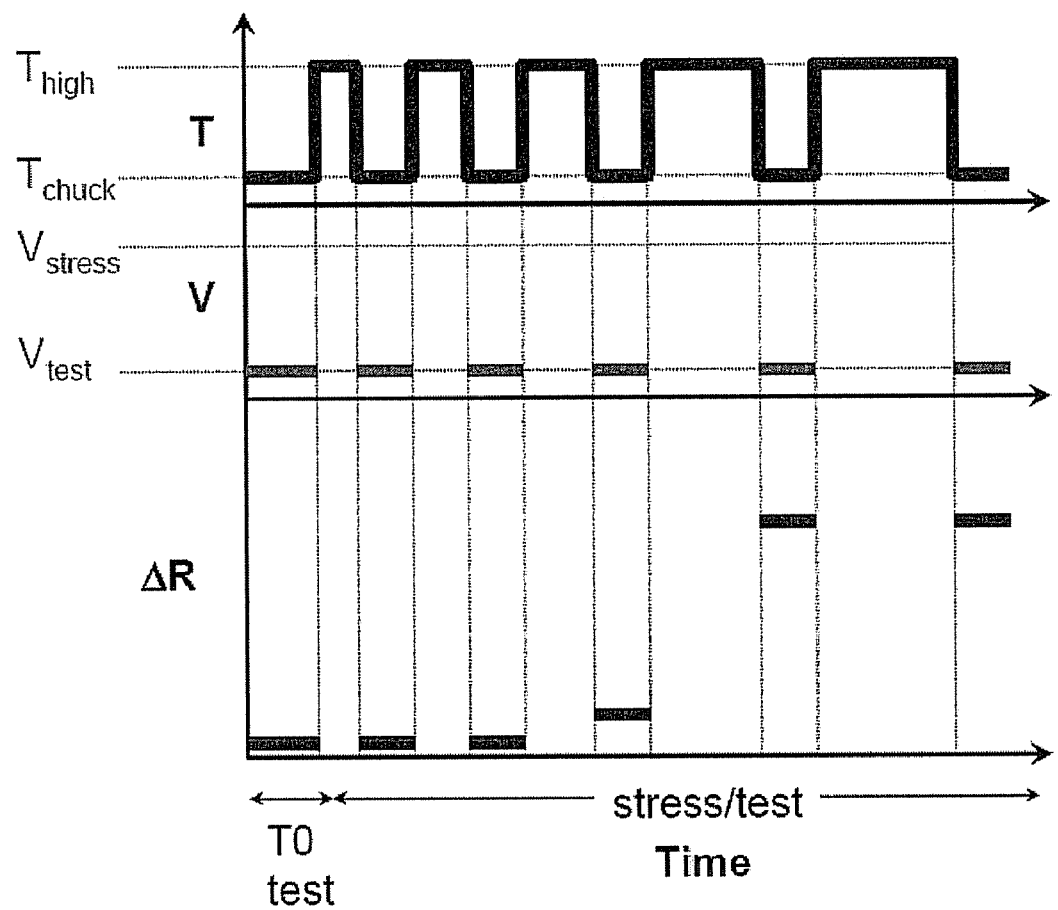
FIG. 4 is a diagram of a test methodology in accordance with another embodiment of the invention.
Figure 5:
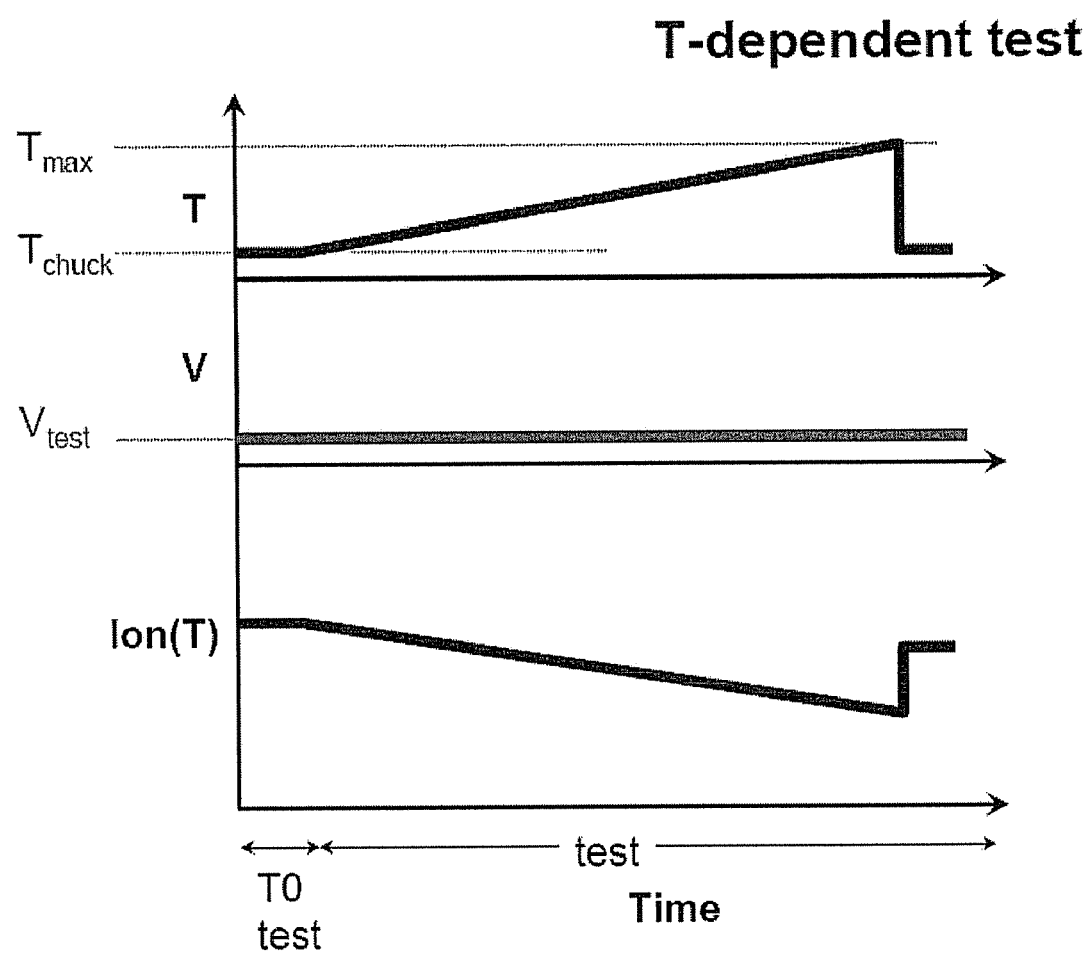
FIG. 5 is a diagram of a test methodology in accordance with another embodiment of the invention.

As shown in FIG. 3, another sequence may be characterized as a relatively high-temperature AC stress condition followed by low-temperature test condition. In another case, shown in FIG. 4, the sequence is characterized as thermal cycle stress conditions with intermediate characterization of a resistance change, $\Delta R$, at a relatively low temperature. In yet another case, the sequence is characterized as a general in-line device characterization of temperature-dependent device properties, as shown in FIG. 5, where the measurement of the driving current as a function of temperature, Ion(T), of the DUT is taken.

Figure 6A:
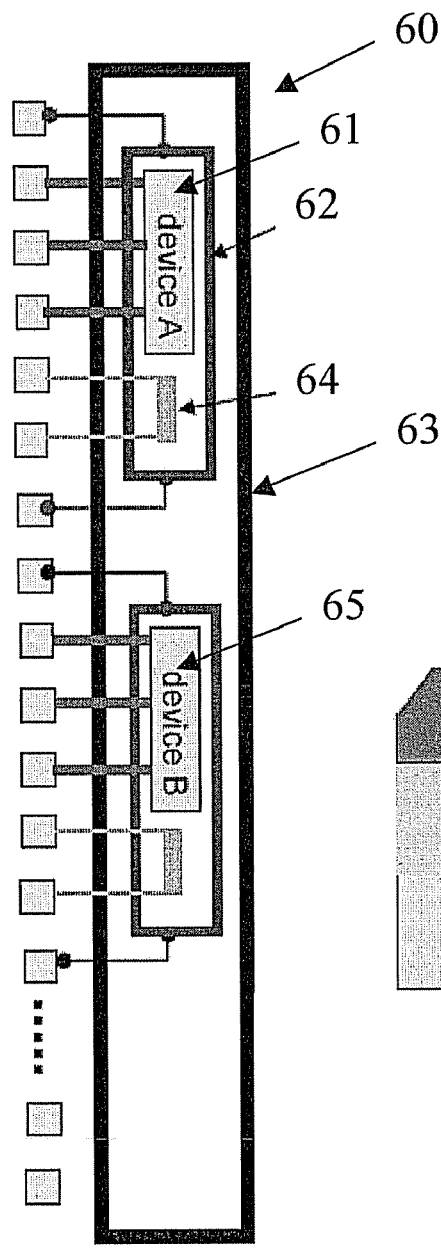
FIGS. 6A and 6B are schematic illustrations of a structure of a device under test.
Figure 6B:
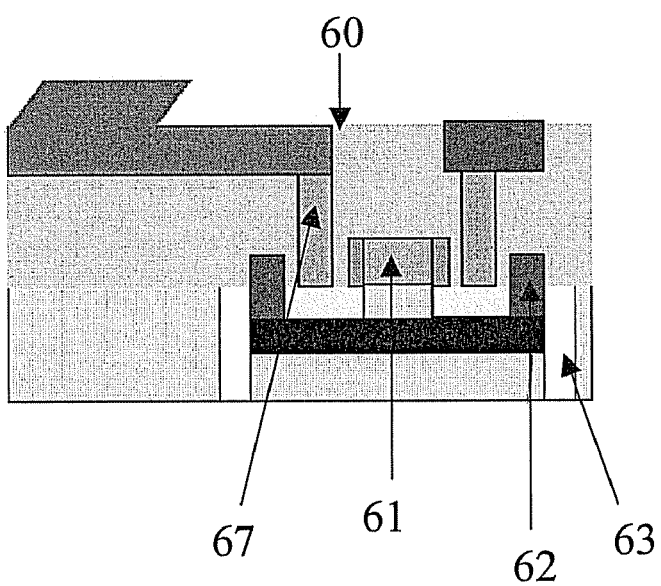

With reference to FIGS. 6A and 6B, a structure 60 or apparatus to implement the in-line test methodology is shown. In the structure 60, a DUT 61 (i.e., device A) is surrounded by a local heater 62, such as diffusion resistors or some other suitable devices, and is enclosed by a thermal insulator 63 to increase the heating efficiency. The thermal insulator 63 may be, for example, a shallow-trench isolation STI, airgaps defined around the DUT 61 and/or buried oxides (BOX) positioned underneath the DUT 61 in silicon-on-insulator SOI technologies. A temperature-sensing unit 64, such as a resistor, a metal wire, a diode or some other suitable device, can be added proximate to or adjacent the DUT 61 within the local heater 62 to monitor a temperature inside a region of interest. Other characteristics of DUT 61, such as changes in drain current, changes in resistance or changes in driving current, may be determined by external test equipments through probing pads connected to DUT 61. As shown in FIG. 6B, a probing unit 67 is disposed proximate to the DUT 61 to connect to external test equipments for conducting the testing of the DUT 61.

Figure 7:
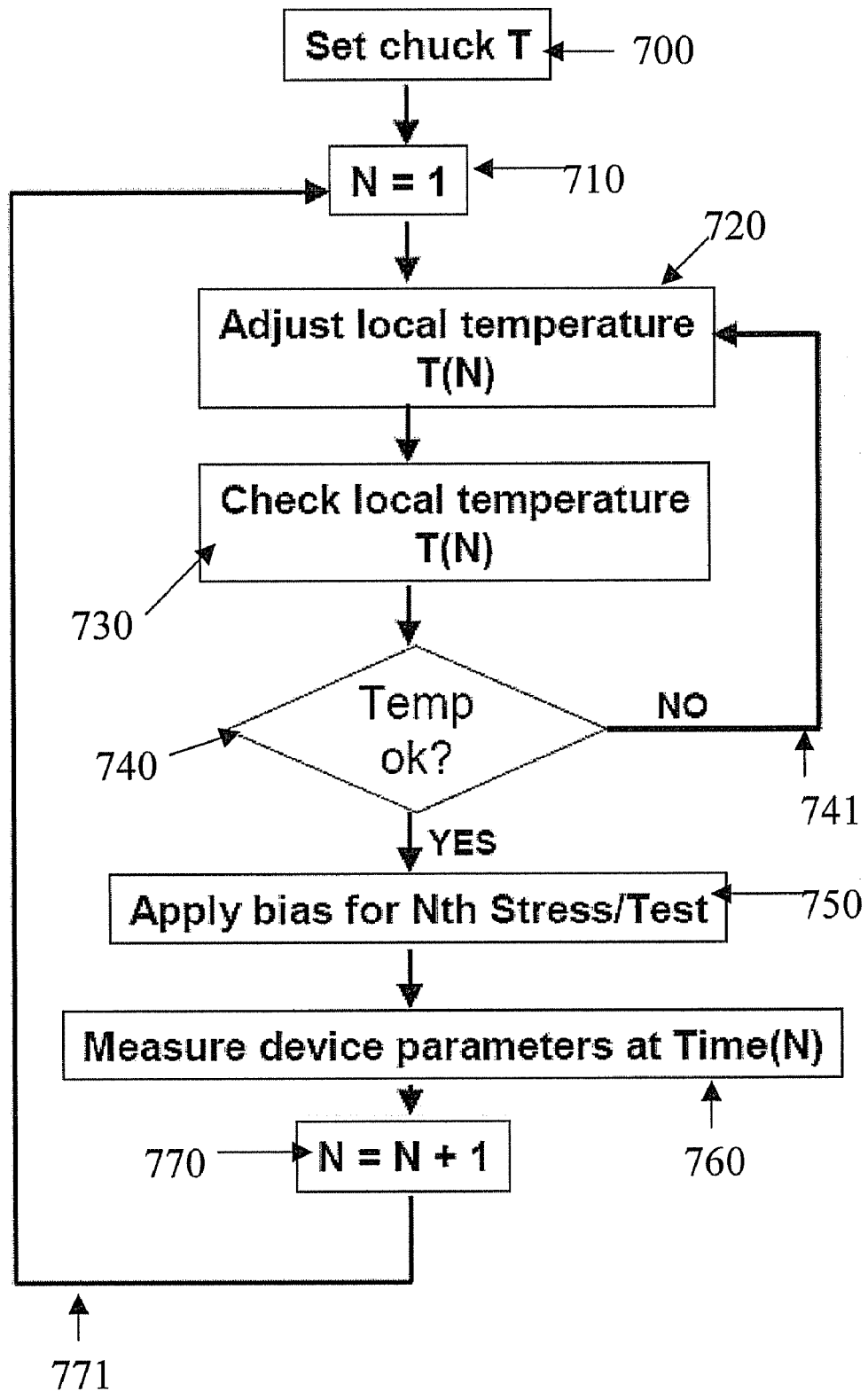
FIG. 7 is a flow diagram illustrating a method of conducting an in-line test of the structure of FIGS. 6A and 6B.

As shown in FIG. 7, a method of conducting an in-line test using the structure of FIGS. 6A and 6B may include setting a chuck temperature T at operation 700. Subsequently, a variable N is set to 1 (operation 710), a local temperature is adjusted by way of the local heater 62 (operation 720) and the local temperature is checked by way of the temperature sensing unit 64 (operation 730). If the local temperature is determined to not be within predefined parameters (operation 740), control returns to operation 720 by way of first loop 741. If, on the other hand, the local temperature is determined to be within the predefined parameters at operation 740, bias is applied to the DUT 61 for the Nth stress test (operation 750). Device parameters, such as drain current, resistance and driving current, are then measured at time T(N) (operation 760). The variable N is then set to N+1 (operation 770) and control returns to operation 710 along loop 771.

Figure 8:
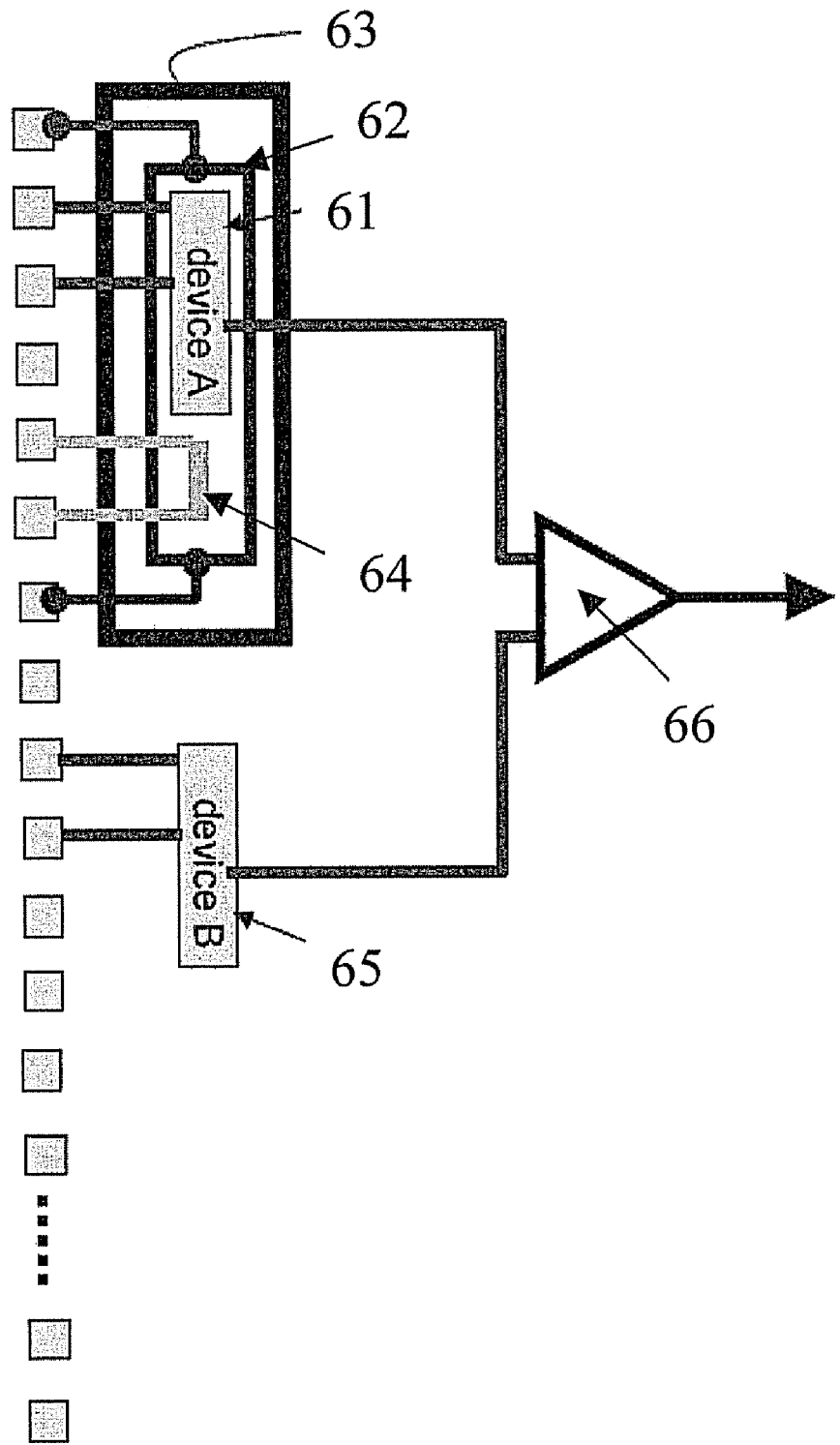
FIG. 8 is a schematic illustration of a structure of a device under test.

With reference to FIG. 8, to further increase a sensitivity of the in-line test in characterizing temperature-dependent device properties, a reference DUT 65 (i.e., device B) can be added in the outside of the heating area which stays at chuck temperature throughout the measurement. The test nodes from the DUT 61, such as a drain of a MOSFET, an anode of a resistor, etc., and that from the reference DUT 65 are fed into a differential amplifier 66 to determine the differentials between the DUT 61 and the reference DUT 65. Therefore, the temperature-dependent device properties can be characterized relative to the reference DUT 65 with relatively improved accuracy. As shown in FIG. 6A, the reference DUT 65 can be included within the thermal insulator 63 and used for comparison measurements relative to those of the DUT 61 without the aid of the differential amplifier 66.

Figure 9:
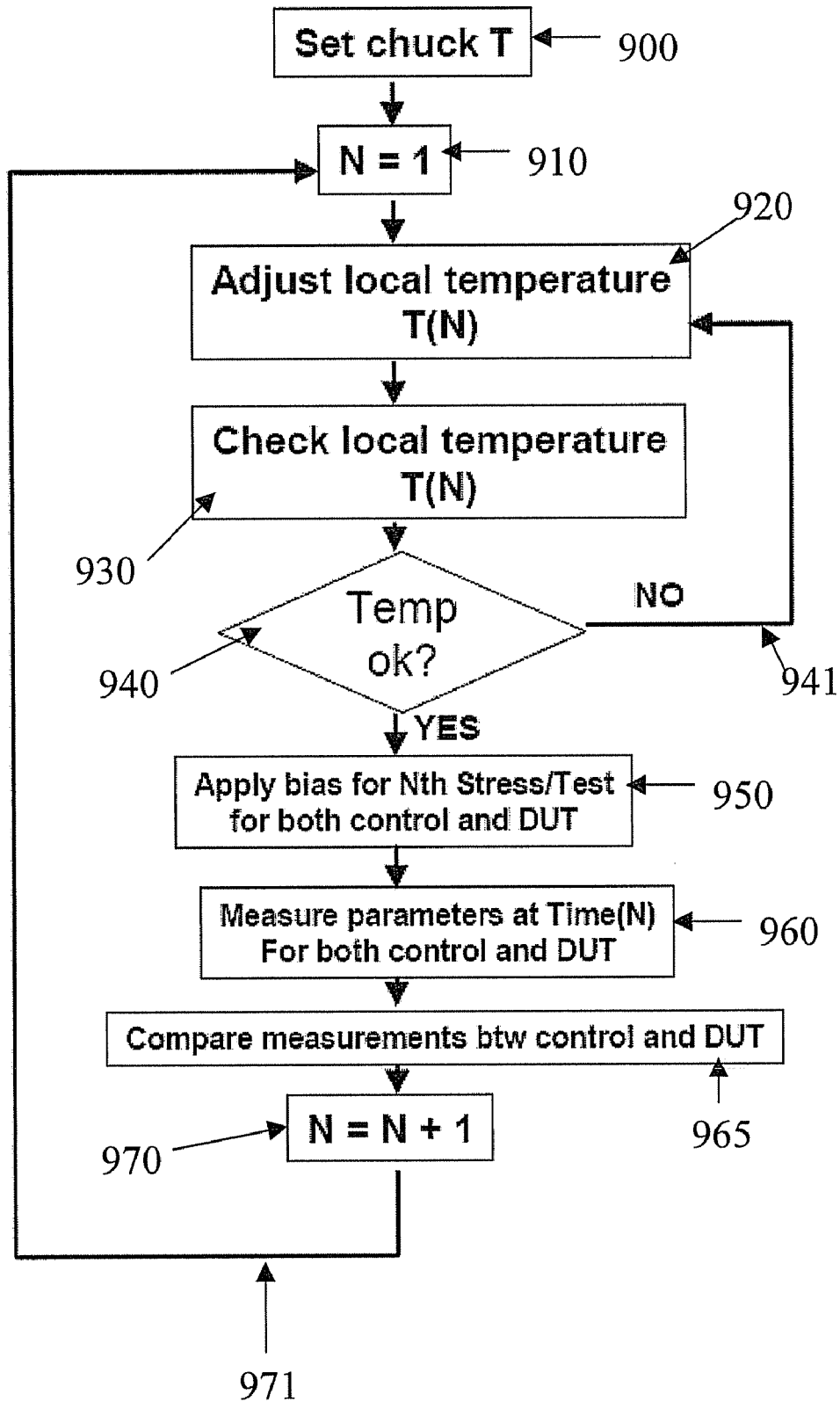
FIG. 9 is a flow diagram illustrating a method of conducting an in-line test of the structure of FIG. 8.

As shown in FIG. 9, a method of conducting an in-line test using the structure of FIG. 8 may include setting a chuck temperature T at operation 900. Subsequently, a variable N is set to 1 (operation 910), a local temperature is adjusted by way of the local heater 62 (operation 920) and the local temperature is checked by way of the temperature sensing unit 64 (operation 930). If the local temperature is determined to not be within predefined parameters (operation 940), control returns to operation 920 by way of first loop 941. If, on the other hand, the local temperature is determined to be within the predefined parameters at operation 940, bias is applied to the DUT 61 and the reference DUT 65 for the Nth stress test (operation 950). Device parameters for the DUT 61 and the reference DUT 65, such as drain current, resistance and driving current, are then measured at time T(N) (operation 960) and the measurements are compared (operation 965). The variable N is then set to N+1 (operation 970) and control returns to operation 710 along loop 971.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. An apparatus, comprising:
    a thermally isolated device under test to which first and second voltages are sequentially applied;
    a local heating element to impart first and second temperatures to the device under test substantially simultaneously while the first and second voltages are sequentially applied, respectively; and a temperature-sensing unit to measure the temperature of the device under test, and further comprising a thermal isolation trench surrounding and providing thermal isolation for the device under test; and a reference device disposed at an exterior of the thermal isolation trench, wherein the device under test and the reference device are connected in parallel with a differential amplifier.

2. The apparatus according to claim 1, further comprising a reference device disposed within the thermal isolation trench.

3. The apparatus according to claim 1, wherein the thermal isolation trench comprises a silicon oxide.

4. The apparatus according to claim 1, wherein the thermal isolation trench comprises air gaps.

5. The apparatus according to claim 1, wherein the local heating element comprises a resistive element.

6. The apparatus according to claim 1, wherein the temperature-sensing unit comprises a diode element.

7. The apparatus according to claim 1, wherein the temperature-sensing unit comprises a resistive element.

8. The apparatus according to claim 1, wherein a measurable characteristic of the device under test comprises at least one of a drain current, a resistance and a driving current of the device under test.

9. The apparatus according to claim 1, wherein the first voltage is applied for an initial time, the second voltage is applied for a stress time and the first voltage is applied for a test time, and wherein the first temperature is imparted for the initial time, the second temperature is imparted for the stress time and a third temperature is imparted for the test time.

10. The apparatus according to claim 1, wherein the first voltage is applied for an initial time and second and first voltages are then sequentially applied during a stress/test time, and wherein the second temperature is imparted during the initial and stress/test times and the first temperature is imparted substantially simultaneously with the last application of the first voltage.

11. The apparatus according to claim 1, wherein the first voltage is intermittently applied, and wherein the first temperature is imparted while the first voltage is applied and the second temperature is imparted while no voltage is applied.

12. The apparatus according to claim 1, wherein the first voltage is continuously applied, and wherein the first temperature is imparted for an initial time, the second temperature is imparted during a test time following a gradual temperature increase, and the first temperature is imparted substantially immediately thereafter.

13. An apparatus, comprising:

a thermally isolated device under test to which first and second voltages are sequentially applied;

a local heating element to impart first and second temperatures to the device under test independently of the first and second voltages being sequentially applied; and a sensor to measure a characteristic of the device under test, and further comprising an isolation trench surrounding and isolating the device under test; and a reference device disposed at an exterior of the isolation trench, wherein the device under test and the reference device are connected in parallel with a differential amplifier.

14. A method of conducting an in-line test of a device under test, the method comprising:

thermally isolating the device under test;

with the device under test thermally isolated, applying first and second voltages to the device under test; and during the applying of the voltages, imparting first and second temperatures to the device under test independently of the applying of the voltages, and further comprising measuring a characteristic of the device under test and a characteristic of a reference device;

comparing results of the measuring of the device under test and the measuring of the reference device; and amplifying a difference between the results.

* * * * *